(12) United States Patent
Bouzid et al.

(10) Patent No.: US 9,029,774 B2
(45) Date of Patent: May 12, 2015

(54) SINGLE PHOTON DETECTOR IN THE NEAR INFRARED USING AN INGAAS/INP AVALANCHE PHOTODIODE OPERATED WITH A BIPOLAR RECTANGULAR GATING SIGNAL

(75) Inventors: Abdessattar Bouzid, Seoul (KR); Sung Wook Moon, Gyeonggi-do (KR); Dong Hoon Yi, Gyeonggi-do (KR); Se Min Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 76 days.

(21) Appl. No.: 13/881,274

(22) PCT Filed: Jun. 28, 2011

(86) PCT No.: PCT/KR2011/004696
§ 371 (c)(1),
(2), (4) Date: Apr. 24, 2013

(87) PCT Pub. No.: WO2013/002430
PCT Pub. Date: Jan. 3, 2013

(65) Prior Publication Data
US 2013/0221221 A1 Aug. 29, 2013

(51) Int. Cl.
G01J 5/20 (2006.01)
H01L 31/09 (2006.01)
G01J 1/44 (2006.01)

(52) U.S. Cl.
CPC ........... *H01L 31/09* (2013.01); *G01J 2001/442* (2013.01); *G01J 2001/4466* (2013.01); *G01J 1/44* (2013.01)

(58) Field of Classification Search
CPC .......................................................... G01J 5/20
USPC ....................................................... 250/338.4
See application file for complete search history.

(56) References Cited

U.S. PATENT DOCUMENTS

| | | | |
|---|---|---|---|
| 2005/0061986 A1 | 3/2005 | Kardynal et al. | |
| 2009/0008564 A1 | 1/2009 | Balan et al. | |

(Continued)

FOREIGN PATENT DOCUMENTS

| | | |
|---|---|---|
| GB | 2 456 149 A | 7/2009 |
| WO | 2009/115956 A2 | 9/2009 |

OTHER PUBLICATIONS

S. Cova, et al; "Avalanche photodiodes and quenching circuits for single-photon detection", Applied Optics, vol. 35, No. 12, pp. 1956-1976; Apr. 20, 1996.

(Continued)

*Primary Examiner* — David Porta
*Assistant Examiner* — Hugh H Maupin
(74) *Attorney, Agent, or Firm* — Ladas & Parry LLP

(57) ABSTRACT

The present invention relates to a single photon detector (SPD) at telecom wavelength of 1.55 μm based on InGaAs/InP avalanche photodiode (APD). In order to operate the SPD at a low after-pulse noise, a DC bias voltage lower than the breakdown voltage is applied to an InGaAs/InP APD. A bipolar rectangular gating signal is superimposed with the DC bias voltage and applied to the APD so as to exceed the breakdown voltage during the gate-on time of each period of the gate signal. The use of the bipolar rectangular gating signal enabling us to operate the APD well below the breakdown voltage during the gate-off time, thereby make the release of the trapped charge carriers faster and then reduces the after-pulse noise. As a result, it permits to increase the repetition rate of the SPD.

16 Claims, 3 Drawing Sheets

(56) References Cited

U.S. PATENT DOCUMENTS

2009/0039237 A1  2/2009  Inoue et al.
2009/0072876 A1  3/2009  Kim et al.
2010/0111305 A1  5/2010  Yuan et al.

OTHER PUBLICATIONS

Akihisa Tomita, et al; "Balanced, gated-mode photon detector for quantum-bit discrimination at 1550 nm", Optics Letters, vol. 27, No. 20, pp. 1827-1829; Oct. 15, 2002.

Akio Yoshizawa, et al; "Gated-mode single-photon detection at 1550 nm by discharge pulse counting", Applied Physics Letters, vol. 84, No. 18, pp. 3606-3608; Published online Apr. 20, 2004.

Guang Wu, et al; "High performance of gated-mode single-photon detector at 1.55 μm", Optics Communications, vol. 265, Issue 1; pp. 126-131, Sep. 2006.

Lilin Xu, et al; "High-speed InGaAs/InP-based single-photon detector with high efficiency", Applied Physics Letters, vol. 94, pp. 161106-1 to 161106-3; published online Apr. 21, 2009.

Naoto Namekata, et al; "1.5GHz single-photon detection at telecommunication wavelengths using sinusoidally gated InGaAs/InP avalanche photodiode", Optics Express, vol. 17, No. 8, pp. 6275-6282; published Apr. 2, 2009.

Z.L. Yuan, et al; "Multi-gigahertz operations of photon counting InGaAs avalanche photodiodes", Applied Physics Letters, vol. 96, pp. 071101-1 to 071101-3; published online Feb. 16, 2010.

International Search Report; mailed Apr. 4, 2012; PCT/KR2011/004696.

SINGLE PHOTON DETECTOR IN THE NEAR INFRARED USING AN INGAAS/INP AVALANCHE PHOTODIODE OPERATED WITH A BIPOLAR RECTANGULAR GATING SIGNAL

TECHNICAL FIELD

The present invention relates to the field of photon detectors and methods for detecting single photons. More particularly, the present invention relates to single photon detectors (SPDs) based on InGaAs/InP avalanche photodiodes (APDs) operated with a bipolar rectangular gating signal.

BACKGROUND ART

Near infrared (NIR) SPD is one of the key components for many applications such as quantum cryptography, optical network testing, semiconductor device analysis, three-dimensional imaging, eye-safe ranging and timing, etc. In optical communication, the wavelength of 1.55 μm is the most desirable for long-distance transmission, since optical fibers exhibit low dispersion and minimum loss (0.2 dB/km) at this wavelength. The most convenient detectors at 1.55 μm are based on InGaAs/InP APDs. APDs used as SPDs are referred to as single photon avalanche diodes (SPADs). SPADs have several advantages, they are compact, have lower operating voltages, cryogenic-free operation and also cost less.

In order to detect a single photon, commercial InGaAs/InP APDs designed for telecommunication applications are usually operated above the breakdown voltage (VBR) in the bi-stable mode. This mode of operation is referred to as the Geiger mode. In Geiger mode, an APD is able to sustain a large electric field across the junction. An incoming photon is absorbed and creates an electron-hole pair. The charge carriers are then swept through the junction and accelerated by the strong electric field. They can gain enough energy to generate secondary electron-hole pairs by impact ionization. These pairs are in turn accelerated and can generate new electron-hole pairs. If the electric field is high enough, impact ionization can yield a self-sustaining current pulse. This multiplication phenomenon is known as an avalanche.

During an avalanche event, some charge carriers created by the avalanche process can be trapped by defects in the SPAD's multiplication layer. If a trapped carrier is liberated during a subsequent gate pulse, it can trigger a new avalanche. Such an avalanche is called an after-pulse.

The after-pulse effect is one of the major bottlenecks limiting the performances of InGaAs/InP SPADs. Therefore, the InGaAs/InP APD is usually operated in gated Geiger mode in which the gate duration is generally set to a few nanoseconds. Then the interval between two consecutive gate pulses is set to more than the lifetime of the trapped carriers (several microseconds), which is very effective in lowering after-pulses. However, this mode allows operation at only megahertz rates; this has rendered InGaAs/InP APDs unsuitable for applications that require high-speed SPDs such as the high-speed clocked quantum key distribution (QKD) systems.

The after-pulse effect can be reduced also by selecting the operating conditions, in particular by decreasing the excess bias voltage and thus limiting the avalanche charges. However, this reduce the amplitude of the avalanche signal, makes it difficult to be discriminated from the APD capacitive response, especially when using fast gating signals.

A patent document 1 discloses a high-speed single-photon detector in telecommunication wavelength band. A DC bias voltage lower than the breakdown voltage is applied to an InGaAs/InP APD. A 500 MHz sine wave gating signal is superimposed with the DC bias voltage and applied to the APD so as to exceed the breakdown voltage by about 4V in a fractional time of each period. The sine wave gating signal passed through the APD is substantially completely removed by a filter, thereby improving signal to noise ratio and enabling to detect a single photon even if the avalanche multiplication time is shortened to reduce the after-pulse and the detection period. As a result, it achieves to detect a single photon in the 1550 nm communication band at a high speed.

A patent document 2 discloses a photon detection system including a photon detector configured to detect single photons, a signal divider to divide the output signal of the photon detector into a first part and a second part, wherein the first part is substantially identical to the second part, a delay mechanism to delay the second part with respect to the first part, and a combiner to combine the first and the delayed second part of the signal such that the delayed second part is used to cancel periodic variations in the first part of the output signal.

A patent document 3 discloses a photon detection system and a method of photon detection. A photon detection system, configured to determine the number of simultaneously detected photons in a pulse of radiation, comprises an APD, part to apply a bias across said photodiode and part to measure the size of an avalanche signal produced by illumination of the photodiode, wherein the avalanche signal is measured before the avalanche current through the photodiode has saturated. The photodiode may be operated in Geiger mode by applying a bias voltage greater than the breakdown voltage of the photodiode for a duration shorter than the time required for the avalanche current to saturate, or for a duration longer than this time in which case the avalanche signal is measured for a duration shorter than the time which the avalanche current take to saturate.

The non-patent document 1 reports an avalanche photodiodes and quenching circuits for single-photon detection. APDs operated above the breakdown voltage in Geiger mode and connected with avalanche-quenching circuits to detect single photons, and are therefore called single photon avalanche diodes (SPADs). Circuit configurations suitable for this mode of operation are critically analyzed and their relative merits in photon counting and timing applications are assessed. Although passive-quenching circuits (PQCs) are useful for SPAD device testing and selection, it has fairly limited applications. Suitably designed active-quenching circuits (AQCs) make it possible to exploit the best performance of SPADs. Thick silicon SPADs that operate at high voltages (250-450V) have photon detection efficiency higher than 50% from 540 to 850 nm wavelength and still ~3% at 1064 nm. Thin silicon SPADs that operate at low voltages (10-50V) have 45% efficiency at 500 nm, declining to 10% at 830 nm and to as little as 0.1% at 1064 nm. The time resolution achieved in photon timing is 20 ps full width at half maximum (FWHM) with thin SPADs; it ranges from 350 to 150 ps FWHM with thick SPADs. The achieved minimum counting dead time and maximum counting rate are 40 ns and 10 Mcps with thick silicon SPADs, 10 ns and 40 Mcps with thin SPADs. Germanium and III-V compound semiconductor SPADs extend the range of photon-counting technique in the NIR region to at least 1600 nm wavelength.

The non-patent document 2 reports a balanced, gated-mode photon detector for quantum-bit discrimination at 1550 nm. A photon detector that combines two APDs has been demonstrated for quantum-bit discrimination at 1550 nm.

Spikes accompanied by signals in a gated mode were canceled by balanced output from the two APDs. The spike cancellation enabled one to reduce the threshold in the discriminators and thus the gate pulse voltage. The dark count probability and after-pulse probability were reduced to 7×10−7 and 7×10−4, respectively, without affecting the detection efficiency equal to 11% at 178 K.

The non-patent document 3 reports a gated-mode single-photon detection at 1550 nm by discharge pulse counting. Gated-mode single photon detection using an APD is characterized by charge and discharge pulses, which are attributable to capacitive behavior. The discharge pulse rather than the photon-induced avalanche pulse is counted in single photon detection, in order to reduce after-pulses. The demonstration adopts an InGaAs/InP APD operating at 1550 nm. After-pulse probability per gate is evaluated at a repetition frequency of 5 MHz.

The non-patent document 4 reports a high performance of gated-mode single-photon detector at 1.55 µm. High performances of single photon detection at 1.55 µm were achieved by operating InGaAs/InP APDs in the gated-mode at the optimized temperature. As short pulses used in the gated-mode detection produce strong spikes, a transformer-based method was used to cancel the spikes, which makes it possible to reduce the dark counts by using short-gate pulse durations, and to discriminate the avalanche signals at low thresholds. The spike-cancellation single photon detection at the optimized temperature produced a detection efficiency of 20% with a dark-count probability of 3.4×10−7 per pulse. With such a SPD, a stable single photon routing was realized in 155 km optical fibers with an average photon number equal to 0.1 photons/pulse, exhibiting a fringe contrast of 87%.

The non-patent document 5 reports a high-speed InGaAs/InP-based single-photon detector with high efficiency. An efficient SPD at telecom wavelength of 1.55 µm was realized with an InGaAs/InP APD at −30° C. By implementing a short gating pulse and optimizing the self-differencing circuit, a detection efficiency of 29.3% was achieved with an error count probability of 6% at the gating frequency of 200 MHz, paving the way for the high-efficiency and low-noise fast detection of the NIR single photons.

The non-patent document 6 reports a 1.5 GHz single-photon detection at telecommunication wavelengths using sinusoidally gated InGaAs/InP avalanche photodiode. The SPD is based on a sinusoidally gated InGaAs/InP APD. The gate repetition frequency of the SPD reached 1.5 GHz. A quantum efficiency of 10.8% at 1550 nm was obtained with a dark count probability per gate of 6.3×10−7 and an after-pulse probability of 2.8%. Moreover, the maximum detection rate of the detector is 20 MHz.

The non-patent document 7 reports a multi-gigahertz operation of photon counting InGaAs avalanche photodiodes. An InGaAs/InP APD is operated at 2 GHz for efficient single photon detection at telecom wavelengths. Employing a self-differencing circuit that incorporates tuneability in both frequency and arm balancing, extremely weak avalanches can now be sensed so as to suppress after-pulses. The after-pulse probability is characterized as 4.84% and 1.42% for a photon detection efficiency of 23.5% and 11.8%, respectively. The device will further increase the secure bit rate for fiber wave-length quantum key distribution.

Patent document 1: US 2009/0039237 A1
Patent document 2: US 2010/0111305 A1
Patent document 3: GB 2456149 A Non-patent document 1: S. Cova, M. Ghioni, A. Lacaita, C. Samori, and F. Zappa, "Avalanche photodiodes and quenching circuits for single-photon detection", Appl. Opt., vol. 35 no. 12, pp. 1956-1976, 1996.

Non-patent document 2: A. Tomita, and K. Nakamura, "Balanced, gated-mode photon detector for quantum-bit discrimination at 1550 nm", Opt. Lett., vol. 27 no. 20, pp. 1827-1829, 2002.

Non-patent document 3: A. Yoshizawa, R. Kaji, and H. Tsuchida, "Gated-mode single-photon detection at 1550 nm by discharge pulse counting", Appl. Phys. Lett., vol. 84 no. 18, pp. 3606-3608, 2004.

Non-patent document 4: G. Wu, C. Zhou, X. Chen, and H. Zeng, "High performance of gated-mode single-photon detector at 1.55 µm", Opt. Com. Vol. 265, pp. 126-131, 2006.

Non-patent document 5: L. Xu, E Wu, X. Gu, Y. Jian, G. Wu, and H. Zeng, "High-speed InGaAs/InP-based single-photon detector with high efficiency", Appl. Phys. Lett., vol. 94, pp. 161106, 2009.

Non-patent document 6: N. Namekata, S. Adachi, and S. Inoue, "1.5 GHz single-photon detection at telecommunication wavelengths using sinusoidally gated InGaAs/InP avalanche photodiode", Opt. Express, vol. 17 no. 8, pp. 6275-6282, 2009.

Non-patent document 7: Z. L. Yuan, A. W. Sharpe, J. F. Dynes, and A. R. Shields, "Multi-gigahertz operation of photon counting InGaAs avalanche photodiodes", Appl. Phys. Lett., vol. 96, pp. 071101, 2010.

DISCLOSURE OF INVENTION

Technical Problem

The present invention provides a solution for single photon detectors (SPDs) based on InGaAs/InP avalanche photodiode (APD) to reduce the after-pulse noise.

Further the present invention provides a solution to boost the repetition rate of SPDs based on InGaAs/InP APDs.

Solution to Problem

In accordance with an aspect of the present invention, the above object can be accomplished by selecting the operating conditions that make the release of the trapped charge carriers faster. The present invention provides a single photon detection system comprising an APD configured to detect single photons in the NIR, bias mean to apply a reverse DC bias voltage lower than the breakdown voltage VBR of the APD to the cathode of the APD, gating mean to apply a bipolar rectangular gating signal to the APD in superposing with the reverse DC bias voltage so as to exceed the breakdown voltage of the APD during the gating time and operate it in gated Geiger mode.

Advantageous Effects of Invention

In comparison with conventional InGaAs/InP APDs operated with rectangular gating signal, the use of the bipolar rectangular gating signal enabled us to operate the APD well below the breakdown voltage during the gate-off time. This mode of operation can decrease the electric field intensity across the APD during the gate-off time, and then reduces the lifetime of the trapped charge carriers, therefore makes its release faster. As a results, it permits to reduce the after-pulse probability and increase the SPD speed.

BRIEF DESCRIPTION OF DRAWINGS

The above and other aspects, features and advantages of the disclosed exemplary embodiments will be more apparent from the following detailed description taken in conjunction with the accompanying drawings in which.

MODE FOR THE INVENTION

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
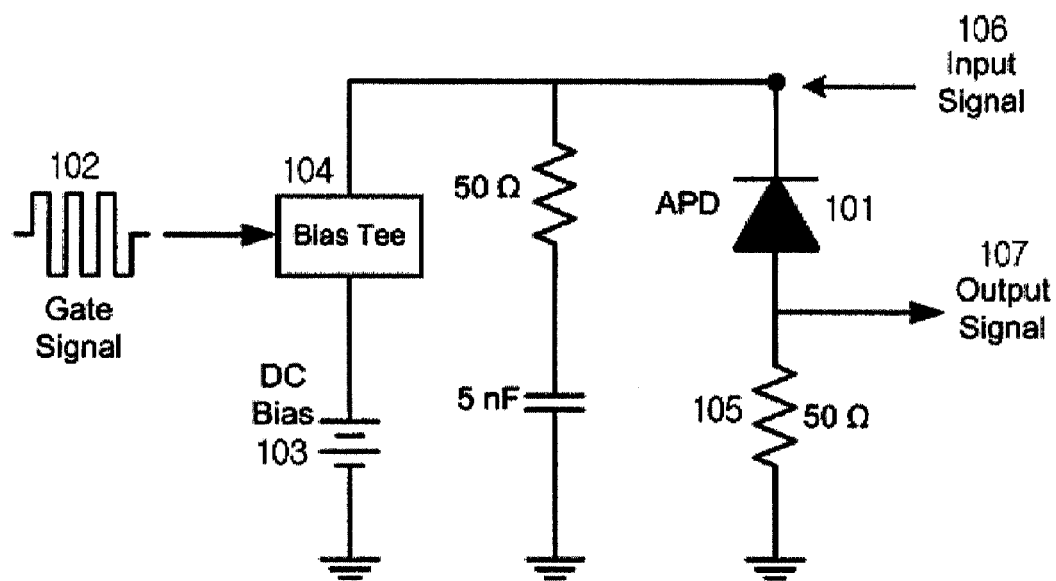
FIG. 1 is a schematic of the SPD with bipolar rectangular gating signal using an APD according to one embodiment of the present invention.
Figure 2:
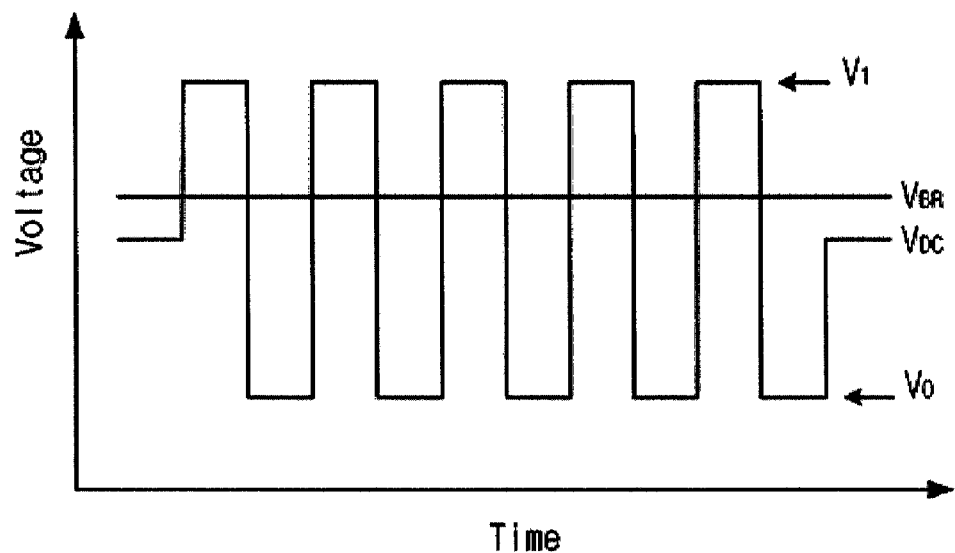
FIG. 2 is a schematic plot of the bipolar rectangular gating signal against time according to one embodiment of the present invention.
Figure 3:
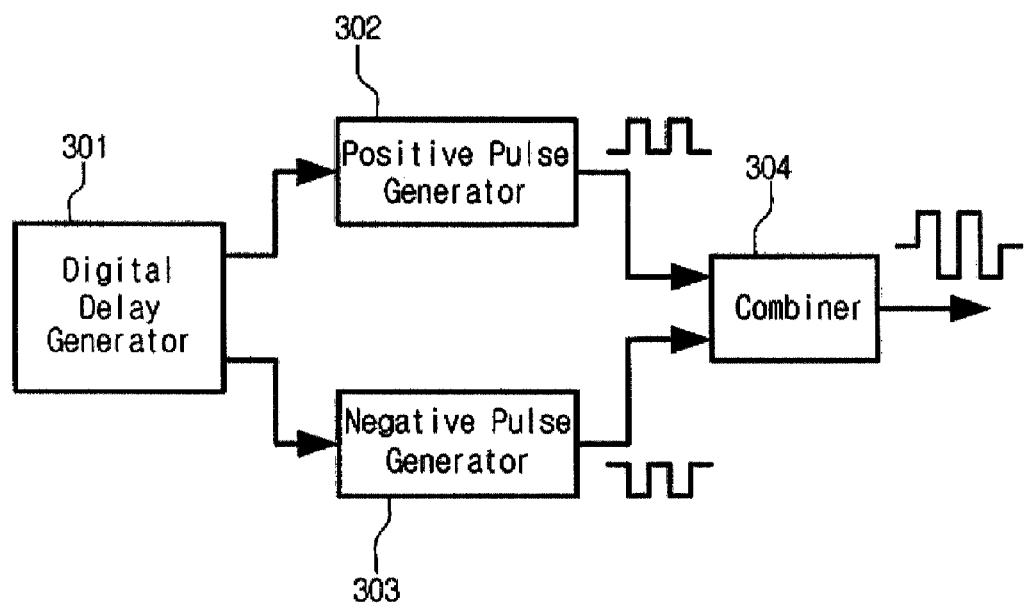
FIG. 3 is a schematic graph of a generator of a bipolar rectangular gating signal according to one embodiment of the present invention.

FIG. 1 is a schematic of the SPD with bipolar rectangular gating signal using an APD according to one embodiment of the invention. FIG. 2 is a schematic plot of the bipolar rectangular gating signal against time according to one embodiment of the invention. FIG. 3 is a schematic graph of a generator of a bipolar rectangular gating signal according to one embodiment of the invention.

FIG. 1 shows the schematic of the SPD with bipolar rectangular gating signal of one exemplary embodiment of the present invention. It comprises an InGaAs/InP APD 101 configured in reverse bias and a resistor 105. The gate signal 102 is a bipolar rectangular signal. The DC bias voltage 103 is a reverse bias voltage less than the breakdown voltage (VBR) of the APD 101. Using the Bias Tee 104 to superimpose the gate signal 102 and the DC bias voltage 103, the resulting signal from the Bias Tee 104 is the input signal 106 of the APD 101 and it exceeds VBR of APD 101 during the gate-on time. The output signal 107 can be detected by measuring the voltage drop across the resistor 105.

FIG. 2 shows the input signal of the SPD as a function of time. The input signal is a periodic series of bipolar rectangular voltage pulses, which varies between a first value V0 and a second value V1. The voltage V0 is selected to be well below the breakdown voltage VBR of the APD 101 so as to reduce the electric field across the junction of the APD 101 during the gate-off time. The voltage V1 is selected so as to exceed the breakdown voltage VBR of the APD 101 during the gate-on time. When such an input signal is applied to the APD 101, the detector becomes sensitive to incoming photons. An absorbed photon generates an electron-hole pair in the APD sensitive area. Due to the high electric field within the multiplication region of the APD, the generated electron hole-pair may trigger an avalanche causing a macroscopic and detectable current flow through the APD. The macroscopic current pulse can be detected by monitoring the voltage drop across the resistor 105 as shown in FIG. 1.

FIG. 3 shows the schematic graph of a generator of a bipolar rectangular gating signal. The gate signal is a periodic series of bipolar rectangular voltage pulses. The digital delay generator 301 acts as the time base of the system, it triggers both positive pulse generator 302 and negative pulse generator 303, the time delay between the triggering signals of the two pulse generators was set so as the falling edge of the positive pulse coincides with the falling edge of the negative pulse. The combiner 304 is used to combine the positive and the negative pulse signals. The resulting signal from the combiner is a periodic series of bipolar rectangular voltage pulses.

Figure 4:
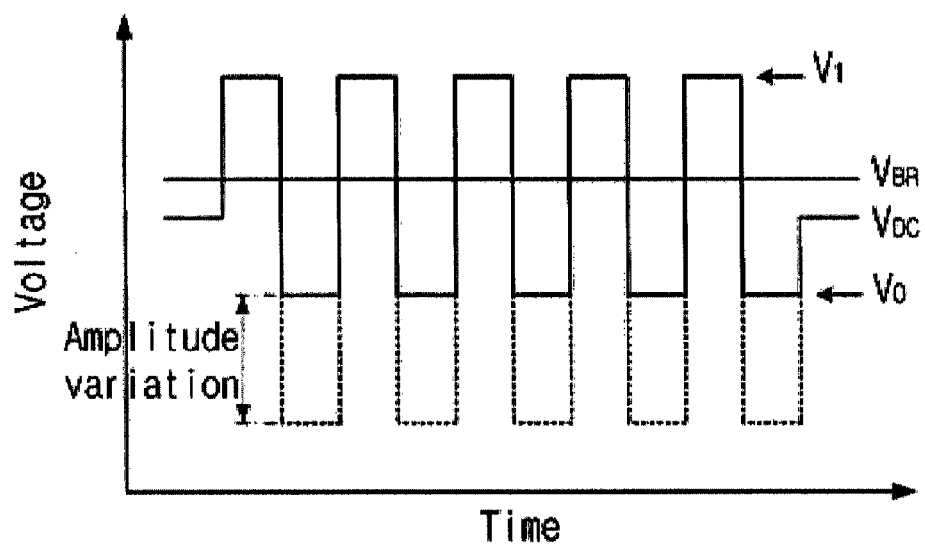
FIG. 4 is a schematic plot of a bipolar rectangular gating signal against time with varied amplitude of the negative pulse of the gate signal time according to one embodiment of the present invention.
Figure 5:
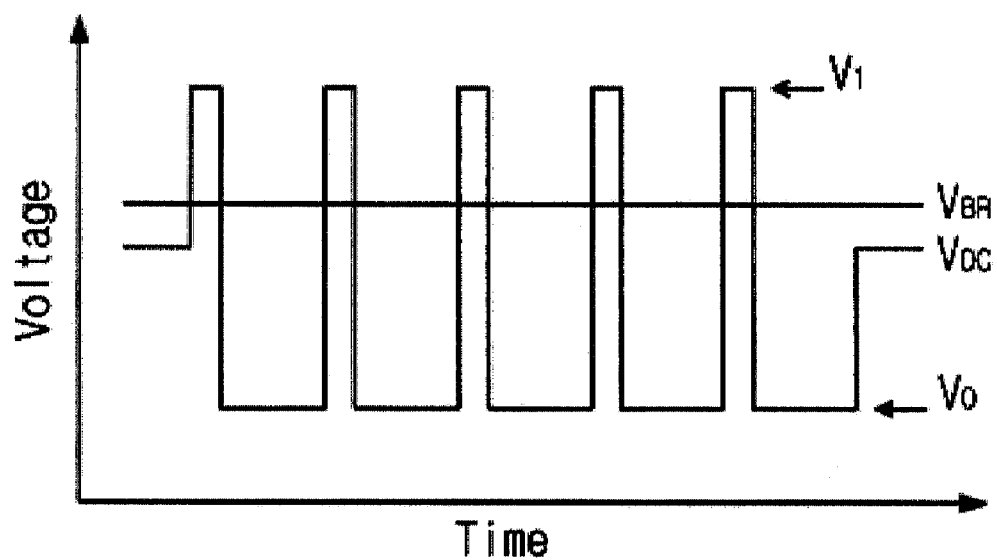
FIG. 5 is a schematic plot of a bipolar rectangular gating signal against time with varied duty cycle according to one embodiment of the present invention.

FIG. 4 and FIG. 5 show an alternative version of the bipolar rectangular gating signal when varying the amplitude of the negative pulse and the duty cycle of the gating signal. Actually, it is possible to bias the SPD with any periodic voltage signal as long as the signal has sufficient swing to operate the APD above and below the breakdown voltage VBR of the APD during the gate-on and the gate-off time, respectively. In fact, the after-pulse can be further suppressed by decreasing the amplitude of the negative pulse comparing to that of the positive pulse because this can further reduce the electric filed during the gate-off time, thereby enhances the release of the trapped charge carriers. The duty cycle of the gating signal depends on the repetition frequency. Usually, in order to reduce the dark count rate and the after-pulse probability the gate-on time is set to a few nanoseconds followed by a gate-off time for the rest of the period. With low repetition rate of the gating signal, the duty cycle of the gate is low and it starts to increase when increasing the gate frequency.

While the exemplary embodiments have been shown and described, it will be understood by those skilled in the art that various changes in form and details may be made thereto without departing from the spirit and scope of the present disclosure as defined by the appended claims.

In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

Industrial Applicability

In comparison with conventional InGaAs/InP APD operated with rectangular gating signal, the use of the bipolar rectangular gating signal enabled us to operate the APD well below the breakdown voltage during the gate-off time. This mode of operation can decrease the electric field intensity across the APD during the gate-off time, and then reduces the lifetime of the trapped charge carriers, therefore makes its release faster. As a result, it permits to reduce the after-pulse probability and increase the SPD speed.

The invention claimed is:

1. A single photon detector (SPD) configured to detect single photons comprising:
    an avalance photodiode (APD) made of InGaAs/InP for detecting single photons in the near infrared (NIR);
    a bias part for applying a reverse DC bias voltage less than the breakdown voltage of the APD to the cathode of the APD;
    a gate signal generator for applying a periodic series of bipolar rectangular voltage pulses to the APD; and
    a bias tee to superimpose the reverse DC bias voltage and the periodic series of bipolar rectangular voltage pulses for applying to the APD so as to exceed the breakdown voltage of the APD,
    wherein the gate signal generator comprises:
        a positive pulse generator to generate positive pulses with varied amplitude and width;
        a negative pulse generator to generate negative pulses with varied amplitude and width.

2. The SPD according to claim 1, wherein the gate signal generator comprises:
    a digital delay generator to trigger both positive pulse generator and negative pulse generator and set the delay between the generated positive pulse and the generated negative pulse such that the falling edge of the generated positive pulse and the falling edge of the generated negative pulse coincide; and
    a combiner to combine the generated positive pulses and the generated negative pulses such that the output signal from the combiner is a periodic series of bipolar rectangular voltage pulses.

3. The SPD according to claim 1, wherein the duty cycle of the gate signal is varied.

4. The SPD according to claim 2, wherein the duty cycle of the gate signal is varied.

5. The SPD according to claim 1, wherein the amplitude of the gate signal is varied.

6. The SPD according to claim 2, wherein the amplitude of the gate signal is varied.

7. A single photon detector comprising:
    a gate signal generator comprising:
        a digital delay generator;
        a positive pulse generator coupled to the digital delay generator in which the positive pulse generator is configured to generate positive pulses with varied amplitude and width;
        a negative pulse generator coupled to the digital delay generator in which the negative pulse generator is configured to generate negative pulses with varied amplitude and width;
        a combiner coupled to both the positive and negative pulse generators in which the combiner is configured to combine together the generated positive pulses and the generated negative pulses and to output a gate signal that comprises a periodic series of bipolar rectangular voltage pulses;
    a bias tee coupled to the gate signal generator and to a DC bias source in which the bias tee is configured to superimpose a reverse DC bias voltage from the DC bias source and the gate signal from the gate signal generator into an input signal; and
    an avalanche photodiode (APD) coupled to the bias tee in which a cathode of the APD is configured to receive the input signal from the bias tee and an anode of the APD is configured to provide an output signal.

8. The single photon detector of claim 7, wherein the input signal from the bias tee is configured to exceed a breakdown voltage of the APD.

9. The single photon detector of claim 7, wherein the DC bias source is configured to applying the reverse DC bias voltage at less than a breakdown voltage of the APD.

10. The single photon detector of claim 7, wherein the digital delay generator is configured to set a delay between the generated positive pulse and the generated negative pulse such that a falling edge of the generated positive pulse and a falling edge of the generated negative pulse coincide.

11. The single photon detector of claim 7, wherein the input signal from the bias tee comprises the periodic series of bipolar rectangular voltage pulses which varies between a first voltage (V0) value and a second voltage (V1) value.

12. The single photon detector of claim 11, wherein the V0 value is configured to be below a breakdown voltage of the APD so as to reduce an electric field across a junction of the APD during a gate-off time period.

13. The single photon detector of claim 11, wherein the V1 value is configured to exceed a breakdown voltage of the APD during a gate-on time period.

14. The single photon detector of claim 7, wherein the digital delay generator is configured to act as a time base.

15. The single photon detector of claim 7, further comprising a resistor coupled to the anode of the APD such that a voltage drop across the resistor can be used to detect a macroscopic current pulse associated with a single absorbed photon in the APD.

16. The single photon detector of claim 10, wherein the digital delay generator is configured to trigger both the positive pulse generator and the negative pulse generator.

* * * * *